United States Patent [19]
Wang

[11] Patent Number: 5,939,933
[45] Date of Patent: Aug. 17, 1999

[54] INTENTIONALLY MISMATCHED MIRROR PROCESS INVERSE CURRENT SOURCE

[75] Inventor: Paul P.S. Wang, Dana Point, Calif.

[73] Assignee: Adaptec, Inc., Milpitas, Calif.

[21] Appl. No.: 09/023,395

[22] Filed: Feb. 13, 1998

[51] Int. Cl.[6] .................................................. H01L 35/00
[52] U.S. Cl. ..................... 327/512; 327/513; 327/530; 323/315
[58] Field of Search ................................ 327/512, 513, 327/530, 538, 543; 323/312, 315

[56] References Cited

U.S. PATENT DOCUMENTS

| | | | |
|---|---|---|---|
| 5,038,053 | 8/1991 | Djenguerian et al. | 327/513 |
| 5,757,175 | 5/1998 | Morishita et al. | 323/315 |
| 5,783,936 | 7/1998 | Girard et al. | 323/315 |

*Primary Examiner*—Timothy P. Callahan
*Assistant Examiner*—Jung Ho Kim
*Attorney, Agent, or Firm*—Christie, Parker & Hale, LLP

[57] ABSTRACT

An MOS transistor current source has a current mirror constructed of an MOS transistor pair with the transistors having intentionally mismatched W/L aspect ratios such that the intentionally mismatched transistor pair develops a mirror current that varies in an inversely proportional fashion to the process. A precision reference current drives a first, short channel device of the pair which develops a bias voltage which is coupled to the gate terminal of a second, long channel device of the pair. The long channel device conducts a current in operative response to the bias voltage, which current will increase or decrease a corresponding amount in an inversely proportional relationship to the drive strength of the short channel device.

20 Claims, 3 Drawing Sheets

INTENTIONALLY MISMATCHED MIRROR PROCESS INVERSE CURRENT SOURCE

FIELD OF THE INVENTION

This invention relates generally to MOS transistor current sources, and more particularly to MOS transistor current sources that provide a bias current with an inverse proportionality to process, temperature and bias voltage tolerance variations.

BACKGROUND OF THE INVENTION

A very useful building block in MOS analog circuit design is the current source which ideally provides a current reference which is independent of power supply and temperature variations. Many applications in digital and analog circuit design require such a building block which functions to provide a stable voltage or current. For example, analog MOS circuits provide for direct on-chip interfacing between various digital components and, particularly, provide for the necessary stabilized bias for differential amplifiers, operational amplifiers, comparators and the like. The biasing stage for these circuit types typically consist of current sources or sinks in combination with current mirrors which distribute the developed bias currents to the various stages of an analog circuit.

MOS current sources have come to be widely used in analog integrated circuits both as biasing elements and as load devices for amplifier stages, particularly in applications when the use of such current sources and biasing offer superior insensitivity of circuit performance to power supply and temperature variations. Moreover, MOS current sources are frequently more economical to fabricate on a silicon chip than resistors because they can be implemented with a smaller chip area footprint than corresponding resistors, particularly when the value of the required bias current is very small. In addition, when used as a load element in integrated circuit amplifier stages, the generally high incremental resistance of an MOS current source offers a desirably high voltage gain at relatively low power supply voltage levels.

A typical output current characteristic (the drain characteristic) for a simple current source circuit is illustrated in FIG. 1. The vertical axis is the output current ($I_O$) while the horizontal axis is voltage ($V_{ds}$). The output trace depicts the drain characteristics of a typical current source for both the hypothetical case where the output resistance ($r_o$) is infinite, i.e., the output current $I_o$ is completely independent of voltage, and the physical case where the output resistance is finite, i.e., the output current is a function of voltage.

The schematic diagram of a conventional two-transistor MOS current source, implemented with n-channel MOS transistors, is illustrated in FIG. 2. The current source includes two n-channel field effect transistors N1 and N2 which each have their source terminals connected to ground potential and their gate terminals commonly coupled together. Their common gate terminals are coupled to the drain of n-channel transistor N1 at a node which is also connected to the bottom of a current set resistor R. A power supply voltage, such as $V_{DD}$ is connected to the other end of the current set resistor R and provides the voltage source for developing a reference current $I_{ref}$ across the resistor R.

The reference current $I_{ref}$ is introduced to the n-channel transistor N1 as a drain current $I_D$ which, as it is developed through transistor N1, causes a voltage $V_{DS}$ to be developed across the drain and source nodes of the transistor. Since n-channel transistor N1 has its drain node coupled to its gate terminal, it will be understood that the gate-source voltage $V_{GS}$ will be equal to the drain-source voltage $V_{DS}$. In addition, the same gate-source voltage $V_{GS}$ is developed across the second n-channel transistor N2. In turn, a drain current $I_{D2}$ is developed through transistor N2 in accordance with the well understood current-voltage relationship $$I_{DS2} = k'_2 \frac{W_2}{L_2}(V_{GS2} - V_{T2})^2$$

where:
$I_{DS2}$=the drain source current conducted by transistor N2;
$V_{GS2}$=$V_{GS1}$=the voltage developed across the gate-source terminals of both transistors N1 and N2;
$V_{T2}$=the threshold voltage of transistor N2;
W=the transistor width;
L=the transistor length
k'=the transistor process parameter Assuming that both transistors N1 and N2 are in saturation (a good assumption under the circumstances) the ratio of drain current through the transistors $I_{DS2}/I_{DS1}$=$(W_1L_2)/(W_2L_1)$ in the case where $V_{DS1}$=$V_{DS2}$. It will thus be understood that in the case where the drain-source voltages are equal, the current ratio is controlled by the geometrical device sizes, i.e., the transistor aspect ratios. Therefore, the amount of current sourced by the basic current source of FIG. 2, $I_{DS2}$, is a function of the transistor's aspect ratios and the reference current $I_{ref}$ developed across the resistor R.

Multiple current sources may be developed by adding additional MOS mirror transistors as shown in FIG. 3. Different source currents (drain currents) are easily provided by merely adjusting the aspect ratios (W/L) of the additional n-channel transistors N3 and N4.

The difficulty with conventional prior art-type current source circuit implementations is that the absolute magnitude of the output current will vary considerably with changes in the various manufacturing process tolerances, as well as variations in temperature and voltage. In particular, variations in the photo lithographic process tend to have a significant effect on what are generally termed "short channel" devices, i.e., devices with very large W/L ratios. Line width variations of approximately ±0.1$\mu$ represent an enormous variation to a W/L ratio for a device having a designed channel length L of 0.375$\mu$. It will be evident that such a tolerance variation will have a proportionately smaller effect on a "long channel" transistor whose designed length (L) is on the order of 2.0 to 5.0$\mu$.

However, as device size increases, device switching time also undesirably increases a corresponding amount. Thus, there exists a trade-off between a particular transistor's performance characteristics and the stability of those characteristics under various tolerance variations.

In addition, it is well understood by those having skill in the art of integrated circuit design that the process dependent parameter k' also varies with respect to other manufacturing process tolerance variations, particularly gate oxide thickness, oxide permitivity and the mobility of carriers in the transistor's conductive channel, in turn a function of the semiconductor's dopant level and concentration gradient. All of these process parameters are subject to inherent variability and at various excursion corners cause a transistor's drain current ($I_{DS}$) to vary widely for any given gate-source voltage ($V_{GS}$).

Pertinent to the above discussion of current sources and process parameters, is the notion that current source characteristics are proportional to process parameters.

Conventionally, a process proportional current source provides a smaller output current when the process is termed "slow" and a larger current when the semiconductor manufacturing process is termed "fast". However, many applications require current sources that are invariant to process parameter drift and, indeed, some applications require current sources that have an inverse proportionality to process parameter variation. Given that the prior art has only developed current source circuitry that merely minimizes the response swings to variations in process parameters, there has been a long felt need for a current source circuit that is not only invariant to process parametric changes but also proportionally inverse.

SUMMARY OF THE INVENTION

The present invention seeks to provide a current source, or current sink, circuit whose current conduction characteristics are generally inversely proportional to process parameter induced variations in MOS transistor drive strength, is economical in chip area in terms of both the number of devices required and their sizes, and can be tailored to give a current response that varies from being process inverse to being process invariant.

These goals are accomplished by providing a first, p-channel current mirror pair which mirrors a precision reference current to the drain node of an n-channel bias transistor. The bias transistor's drain is feed-back coupled to its gate terminal such that as the bias transistor conducts the reference current, it develops a bias voltage ($V_{bias}$) which is equal to its gate-to-source voltage ($V_{GS}$) and which is also equal to its gate-to-source voltage ($V_{GS}$), through the well known relation $I_{DS}=k'W/L\ (V_{GS}-V_T)^2$.

The bias transistor is preferably implemented as a "short channel" transistor, such that its W/L aspect ratio is in the range of from about 10 to about 30. Preferably, the bias transistor is conducted with a width dimension W 6 microns and a length dimension L of about 0.375 microns. Accordingly, since the current conducted by the bias transistor (the precision reference current) is fixed, the bias voltage developed by the transistor will vary in an inversely proportional fashion to geometric process parameter tolerance variations, i.e., as W/L decreases a slight amount, the bias voltage must increase in order to maintain the bias transistor's $I_{DS}$ current at a fixed value equal to $I_{ref}$.

The n-channel bias transistor shares a common drain node with an n-channel inverse mirror transistor, such that the inverse mirror transistor conducts a current in operative response to the bias voltage ($V_{bias}$) The inverse mirror transistor is preferably implemented as a "long channel" device, such that its geometric aspect ratio W/L is intentionally mismatched to the aspect ratio W/L of the bias transistor. Preferably, the width dimension W of the inverse mirror transistor is in the range of from about 15 to about 25 microns and its length dimension L is in the range of from about 2.5 to about 3.5 microns. Accordingly, the aspect ratio of the inverse mirror transistor is substantially insensitive to geometrical process tolerance variations.

Because the bias transistor develops a bias voltage which is inversely proportional to the "process" (a "fast" process is characterized by a shorter L dimension) and because the inverse mirror transistor conducts a current directly proportional to the bias voltage in a manner generally insensitive to the "process", the inverse mirror transistor develops a current which is inverse to the "process".

The current conducted by the inverse mirror transistor is further mirrored by a p-channel transistor mirror pair to thereby provide a source of current to a follow-on integrated circuit. In like fashion, the source current so provided may be mirrored by an additional n-channel mirror pair to thereby provide a sink current to any additional follow-on integrated circuit devices. Either the source or sink current mirrors may be implemented with a parallel array of source or sink transistors, with each transistor in the array having a different W/L aspect ratio, as well as different absolute values of the length L dimension. In this manner, separate and individual source or sink transistors may be switched into or out of the circuit so as to tailor the circuit's current response from process inverse to process invariant by merely selecting particular ones of the parallel transistor array.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE INVENTION

Figure 1:
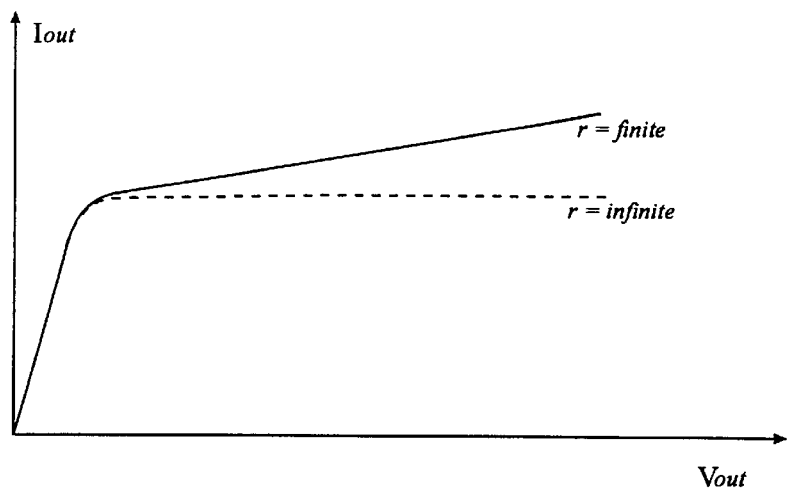
FIG. 1 is a current-voltage plot of the drain characteristic of a simple, two-transistor current source.
Figure 2:
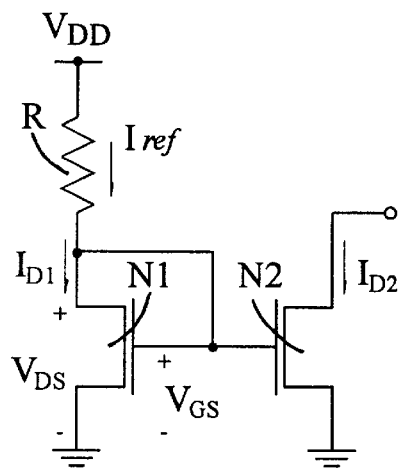
FIG. 2 is a simplified schematic diagram of a conventional, prior two-transistor current source circuit design.
Figure 3:
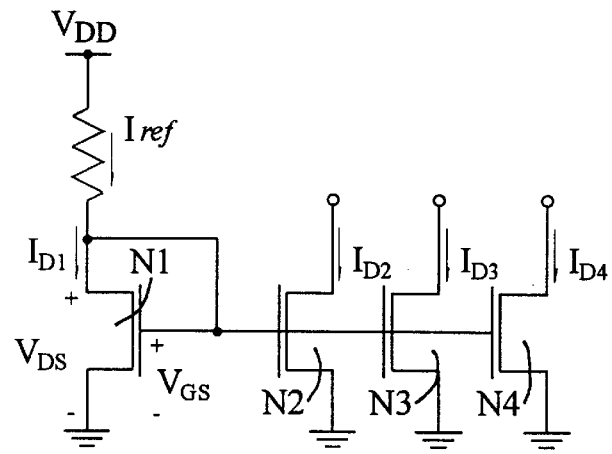
FIG. 3 is a schematic diagram of a simple, prior multiple current source circuit design.
Figure 4:
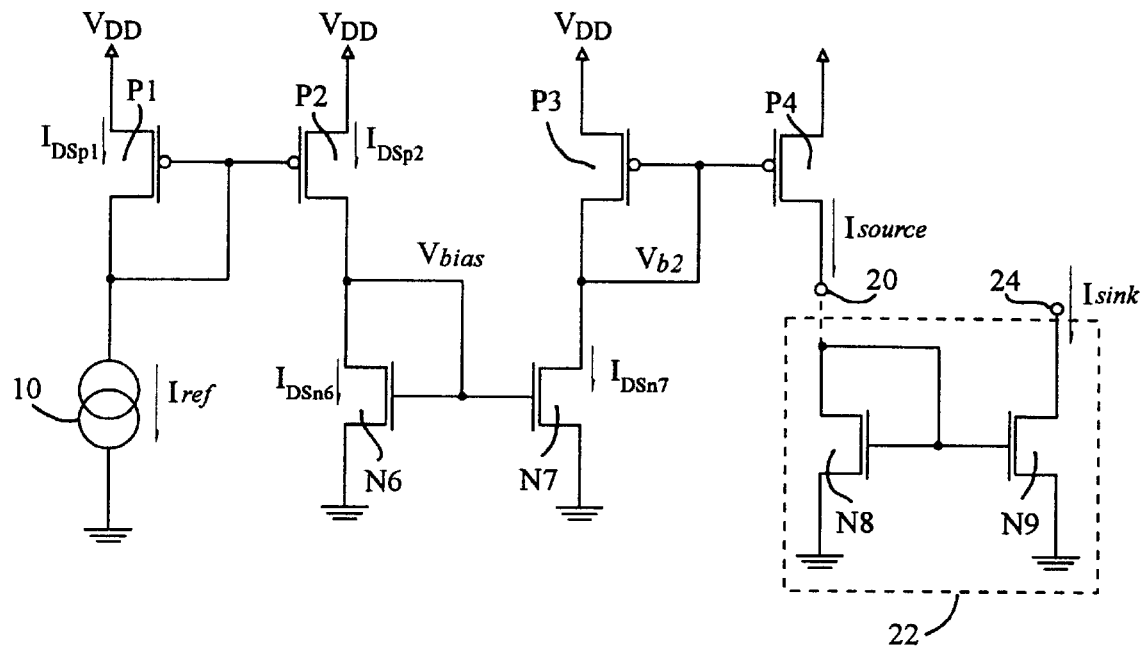
FIG. 4 is a simplified schematic diagram of a preferred mirror process inverse current source according to practice of principles of the present invention.

A preferred circuit arrangement for implementing an intentionally mismatched mirror process inverse current source is depicted in the semi-schematic circuit diagram of FIG. 4. The current source suitably comprises a precision current reference 10 coupled between the drain terminal of a first p-channel transistor P1 and ground potential. The current reference 10 is one of a well understood type which is used when the required values of voltage or current must have greater precision and stability than that ordinarily found in a current source. A $V_T$ referenced source, also known as a bootstrap reference, is an example of one form of precision reference. Various other precision references will immediately suggest themselves to those having skill in the art of integrated circuit design.

Figure 6:
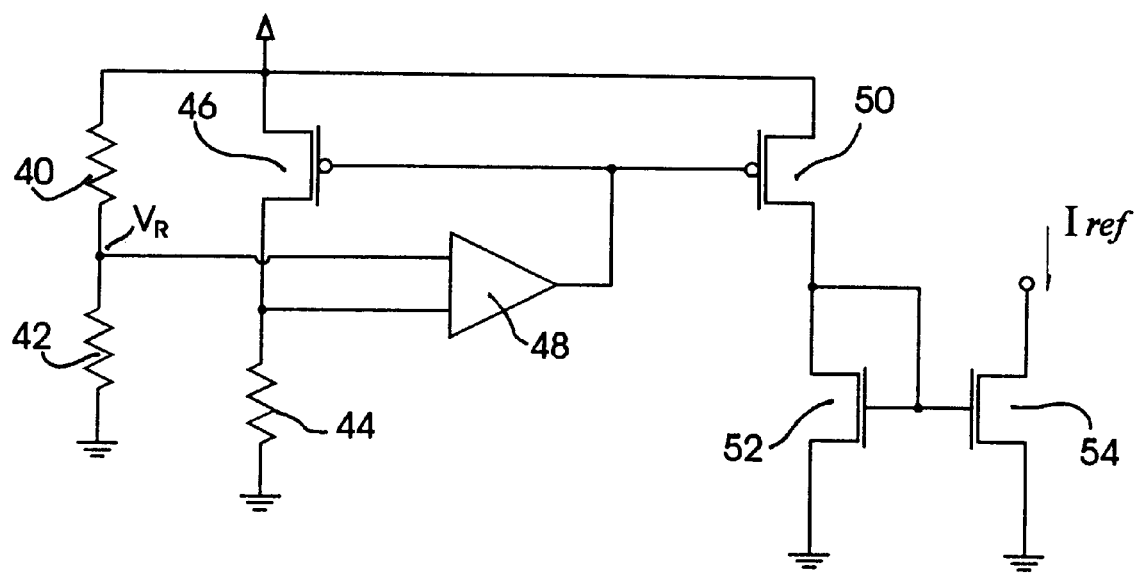
FIG. 6 is a simplified schematic diagram of a reference current generator in accordance with the present invention.

Preferably, the current reference 10 is constructed in the manner depicted by the semi-schematic circuit diagram of FIG. 6. In the circuit of FIG. 6, a known voltage reference $V_R$ is developed across a resistor divider comprising two ratioed resistors 40 and 42, such that the voltage reference $V_R$ is generally stable and independent of process induced variations. The voltage reference $V_R$ is evaluated at one input of a comparator 48, the other input of which is connected to receive a voltage developed across a precision resistor 44. The precision resistor 44 is constructed as a 1.0% resistor and is configured to develop a voltage in response to a current therethrough provided by a p-channel transistor 46. The gate of the p-channel transistor current source is coupled to, and controlled by, the output of the comparator 48, such that the current through transistor 46 is increased or decreased in order to vary the voltage developed across precision resistor 44. This process continues until the voltage across precision resistor 44 is equal to the reference voltage $V_R$ developed through the resistor divider.

In well known fashion, the current developed through p-channel transistor 46 is mirrored through a mirror p-channel transistor 50. This current is then developed into the reference current $I_{ref}$ by action of the n-channel transistor mirror pair 52 and 54 operating in well known conventional fashion.

The precision current reference 10 is provided to develop a reference current $I_{ref}$ therethrough which, in turn is developed across p-channel transistor P1 as $I_{DSP1}$. The gate terminal of p-channel channel transistor P1 is connected in common to the gate terminal of a mirror p-channel transistor P2, as well as being coupled to transistor P1's drain node. P-channel transistors P1 and P2 are configured as a cascode mirror, such that the reference current $I_{ref}$ through p-channel transistor P1 is mirrored through p-channel transistor P2.

The drain current through p-channel, termed herein as bias transistor for reasons which will become evident below, mirror transistor P2 flows through an n-channel transistor N6 which has its drain terminal connected in common with the drain terminal of p-channel transistor P2 and its source connected to ground potential. The drain node of n-channel transistor N6 is coupled to its gate terminal which is also connected to the gate terminal of a mirror n-channel transistor N7. The drain current through n-channel transistor N6 ($I_{DSP2}=I_{DSN6}$) develops a bias voltage $V_{bias}$ which biases the n-channel transistor N6 to conduct the required amount of current driven by the p-channel mirror transistor P2.

Because the gate terminal of the n-channel transistor N6 is coupled to the gate terminal of a mirror n-channel transistor N7, the bias voltage $V_{bias}$ drives the mirror n-channel transistor N7 into conduction. The drain current $I_{DSN7}$ through the n-channel mirror N7 will necessarily be proportional to the current $I_{DSN6}$ through n-channel transistor N6 with the proportionality depending on the aspect ratios and k' parameters of each of the n-channel transistors.

A p-channel transistor P3 is drain-coupled to the drain node of the n-channel transistor N7, and configured as a dynamic resistor. The p-channel transistor P3 functions as the current providing device which provides the drain current $I_{DSN7}$ to the mirror n-channel transistor N7. In a manner very similar to that described in connection with the generation of the bias voltage $V_{bias}$, the common drain node of transistors N7 and P3 is coupled back to the gate terminal of p-channel transistor P3, such that a bias voltage $V_{b2}$ is developed at the common drain node and coupled-back to the gate terminal of transistor P3. It will be understood by those having skill in the art that this second bias voltage $V_{b2}$ is merely the $V_{GS}$ voltage of transistor P3.

This bias voltage $V_{b2}$ is also coupled to the gate terminal of a p-channel current mirror transistor P4 whose drain terminal 20 functions as a current source node when the circuit according to the invention is configured as a current source. It will be understood that the value of the current sourced at the source node 20 ($I_{source}$) will have the same value as the drain current (IDSN7) conducted by the n-channel mirror transistor N7.

Alternatively, if the circuit according to the invention is to be figured as a current sink, two additional n-channel transistors N8 and N9, comprising a current mirror sink block 22, may be added to the circuit in the manner depicted in FIG. 4. The drain terminal of transistor N8 is coupled to the drain node 20 of p-channel transistor P4. The drain node 20 may now be understood as comprising a bias current node, carrying a mirror current having substantially the same value as the drain current developed by p-channel transistor P3 so long as transistors P3 and P4 are constructed to be geometrically identical. This bias current develops a drain-to-source voltage in n-channel transistor N8 which is feed-back coupled to the gate terminal of n-channel transistor N8 and also to the gate terminal of an n-channel mirror transistor N9 as a gate bias voltage. The bias voltage causes mirror transistor N9 to conduct a current, defined as $I_{sink}$, which is developed at its drain node 24.

As has been mentioned above, the current conducted by n-channel transistor N7 will be proportional to the current conducted by n-channel bias transistor N6, with the proportionality depending on their aspect ratios to a first approximation. In accordance with practice of principles of the invention, the first n-channel device N6 is manufactured as a "short channel" device as that term is understood by those having skill in the art of MOS integrated circuit design. Briefly, a "short channel" device is a transistor whose gate length L is designed to be as small (short) as the design rules for that particular MOS architecture allows. Although channel lengths are continually decreasing as process technology moves on, it is generally understood that a "short channel" device is one with a gate length L in the range of about $0.5\mu$ or less. Needless to say, the width W of the n-channel device N6 is adjusted accordingly such that the ratio of width to length (W/L) gives the proper drain current $I_{DS}$ for a given gate voltage ($V_{GS}=V_{bias}$).

As process parameters vary, particularly on the "fast" side, it will be expected that the bias voltage $V_{bias}$ will vary with the "short" n-channel transistor's drive strength. As the current conducting capability of n-channel device N6 increases as a result of process parameter variation, the bias voltage $V_{bias}$ required to develop a particular current through the device N6 will necessarily decrease in order to maintain the $I_{DS}$ current at a constant value.

By way of example, it will be evident that if the process related proportionality factor k' W/L were to increase from an arbitrary nominal value of 2 to a value of 3, it would be necessary for the $(V_{GS}-V_t)^2$ term to decrease from an arbitrary nominal value of 3 to a value of 2 order to maintain the $I_{DS}$ term at a stable arbitrary nominal value of 6. It will be evident that the converse is also true; if the drive strength of the n-channel device N6 decreases as a result of a "slow" process, the bias voltage $V_{bias}$ must increase to accommodate the process parametric shift.

Thus, the bias voltage $V_{bias}$ is seen to be inversely proportional to the current $I_{DSN6}$ of the n-channel device N6. Since this drain current is a function of the drive strength of the device, it may also be said that the bias voltage $V_{bias}$ is inversely proportional to the drive strength of n-channel bias transistor N6. Also, since the drive strength of n-channel transistor N6 is defined by the "process", as that term is understood by those having skill in the art, it will be seen that the bias voltage $V_{bias}$ is inversely proportional to the "process".

In contrast to the bias transistor N6 the n-channel mirror transistor N7 is not manufactured as a "short channel" device, but rather as a "long channel" device such that its current-voltage characteristic is substantially less effected by process parametric tolerance variations than the bias transistor N6. From the foregoing description of n-channel device N6, it will be understood that the bias voltage $V_{bias}$ driving the gate terminal of the mirror transistor N7 will vary inversely with the "short channel" device's drive strength. As the drive strength of n-channel transistor N6 increases, the value of the bias voltage $V_{bias}$ decreases accordingly. As $V_{bias}=V_{GSN7}$ decreases, the current conducted by the mirror transistor N7 decreases a corresponding amount in accordance with the well known relationship $I_D=k' W/L (V_{GS}-V_T)^2$. Since the drive strength of a "long channel" device will be much less susceptible to process parametric variations than a "short" channel device it will be expected that a lower gate voltage $V_{bias}$ will cause the "long" channel length device N7 to conduct a smaller amount of current when the process is characterized as "fast". Conversely, it will be understood that when the process is characterized as "slow" the gate voltage $V_{bias}$ will generally increase over its nominal value and thereby cause the "long" channel length device N7 to conduct a proportionately greater amount of current.

Thus, in contrast to the response characteristics of bias n-channel transistor N6, mirror n-channel transistor N7 is seen to have a drain current $I_{DSN7}$ which is directly proportional to the bias voltage $V_{bias}$. The intentionally mismatched aspect ratios of the n-channel devices N6 and N7 are thus seen to cause their respective portions of the circuit to exhibit complimentary and inverse response characteristics to process parameter tolerance variations. The short channel, high aspect ratio bias transistor N6 is driven with a precision drain current $I_{DSN6}$ which establishes a bias voltage $V_{bias}$ which, in turn varies in an inverse fashion with the device's drive strength. The inversely varying bias current $V_{bias}$ drives a low aspect ratio device N7 (long channel length device) which is generally insensitive to process parametric variations and whose drain current $I_{DSN7}$ varies in direct proportionality with its gate voltage (the bias voltage $V_{bias}$).

Thus, in accordance with the present invention, the intentionally mismatched mirror transistors N6 and N7 in combination function to define a process inverse current source which might, for example, provide a predriver current for process invariant output drivers. Intentionally mismatching the mirror transistors allows transistor N6 to be characterized as a bias transistor, functioning to develop a bias voltage $V_{bias}$ which varies in an inverse fashion with the "process". The mirror transistor N7 may best be characterized as an inverse mirror, since the drain current through the inverse mirror transistor N7 will vary directly with the bias voltage $V_{bias}$ and, thus, in inverse fashion to the drain current through the bias transistor N6.

In accordance with practice of principles of the invention, bias n-channel transistor N6 is constructed with a width dimension W of about $6.0\mu$ and a length dimension L of about $0.375\mu$. The inverse mirror n-channel transistor N7 is preferably constructed with a width dimension W of about $20.0\mu$ and a length dimension L of about $3.0\mu$. Conventional, high-performance MOS photo lithographic processes typically exhibit line width variations on the order of $\pm 0.05\mu$. It will be evident that for a short channel length device, the length dimension L may range from about $0.325\mu$ to $0.425\mu$. This translates into a tolerance window of approximately $\pm 13.3\%$ or a total process tolerance window of about 26.7%. Ignoring the generally second order, process related threshold voltage and k' variations, it will be seen that even line width changes as small as $0.05\mu$ will have a significant effect on a transistor's drain current at any given $V_{GS}$ voltage.

Once the drain current $I_{DSN7}$ is developed through inverse mirror transistor N7, the p-channel mirror transistors P3 and P4 merely translate that amount of current to the drain or output node 20, as do mirror n-channel transistors N8 and N9 with regard to the current sink node 24. So long as each of the transistors of each mirror pair (P3 and P4 and N8 and N9) are manufactured with the same aspect ratio (W/L), the bias voltage is developed and $I_{DS}$ currents sourced or sunk will correspond to the value of the drain current $I_{DSN7}$ developed through the inverse mirror n-channel transistor N7.

It is worth mentioning here, that the inverse proportionality of a current sourced or sunk by the process inverse current source depicted in FIG. 4 may be multiplied in effect and degree by adding additional stages of the circuit as depicted in FIG. 4. In particular, if the circuit were to be configured as a current sink, the drain node 24 of mirror transistor N9 could be redefined as a reference current ($I_{ref2}$) and substituted for the precision reference current generator 10. In other words, the precision reference current $I_{ref}$ can be made to vary with an inverse proportionality to the "process", which effect is multiplied by action of additional, follow-on bias transistor (N6) and inverse mirror transistor (N7) pairs.

Figure 5:
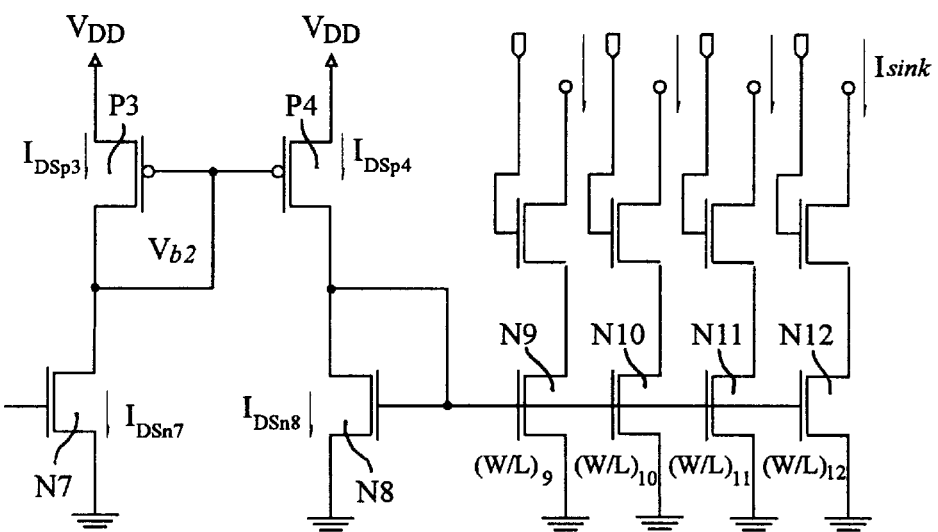
FIG. 5 is a simplified schematic diagram of a multiple mirror process inverse current source circuit design in accordance with the present invention.

Turning now to FIG. 5, there is shown a simplified schematic diagram of a multiple process inverse current source in accordance with practice of principles of the present invention. The circuit of FIG. 5 will be understood to be generally similar to the circuit of FIG. 4, but with a multiplicity of additional n-channel sink transistors N9, N10, N11 and N12 configured into the output path of the sink mirror section 22. Each of the additional n-channel sink transistors N9–N12 have their gate terminals connected in common and configured to be driven by a bias voltage developed by n-channel transistor N8 in combination with the p-channel mirror pair P3 and P4.

The multiple current source of FIG. 5 operates in precisely the same fashion as the process inverse current source of FIG. 4 with the currents through the n-channel devices N9–N12 depending on the value of the voltage applied to their gate terminals and their geometric aspect ratios (W/L). It will be understood that the additional transistors provided on the multiple current source of FIG. 5 may be designed with aspect ratios that monotonically increase from the aspect ratio defined by the inverse mirror n-channel transistor N7. Indeed, the additional mirror n-channel transistors N9–N12 may define a range of aspect ratios or alternatively, be manufactured with the same aspect ratio but with correspondingly smaller absolute values of width W and length L, such that each of the additional mirror n-channel transistors have a proportionately larger or smaller $I_{DS}$ response (as a function of the process) for any given bias voltage on their gates. For example, n-channel transistor N12 may be constructed as a "short channel length" device such that its performance mirrors that of the reference bias n-channel transistor N6 of FIG. 4 and n-channel transistor N9 may be provided as a "long channel length" device, such that its performance mirrors that of the reference inverse mirror n-channel transistor N7. If device N12 were to be designed with a direct process parameter dependent performance characteristic and if device N9 were to be designed with an inverse process parameter dependent performance characteristic, it can be seen that their combination may well give a composite n-channel transistor whose current characteristic is not specifically process inverse, but rather process invariant. The process inverse characteristic of n-channel device N9 will be compensated by the process dependent characteristic of n-channel device N12.

As shown in FIG. 5, each of the additional n-channel mirror transistors N9–N12 may be independently switched into or out of the circuit by a corresponding one of an array of conventional n-channel switch transistors. The gates of each of the n-channel switch transistors may be easily accessed by a control voltage supplied by a, for example, application specific integrated circuit, or other logic circuit configured to assert the appropriate control signals. As the additional transistors are switched into or out of the circuit, it will be understood by those having skill in the art that the proportionality between current and process may be tailored with a high degree of flexibility.

Although the circuit of FIG. 5 is depicted as providing multiple current sinks, it will also be understood by those having skill in the art that multiple current sources are just as easily implemented by propagating gate-coupled p-channel transistors behind device P4, thereby extending the capability of the source block as opposed to the sink block.

Given its ability to source or sink current in either a process dependent, process inverse or process invariant fashion, the current source implemented in accordance with the invention is an excellent candidate for small computer system interface (SCSI) applications, particularly for those applications which require process invariant output drivers. Such SCSI circuits which comprise such output drivers which are operatively responsive to a current source in accordance with the invention, are able to transmit and receive digital data information across the SCSI bus with a high degree of reliability.

While a particular embodiment of the invention has been shown and described, numerous variations and alternative embodiments will immediately occur to those skilled in the art of integrated circuit design. Having thus described an embodiment of the invention, it will now be appreciated that the objects of the invention have been fully achieved and that differing embodiments and applications of the invention will suggest themselves without departing from the spirit and scope of the invention, which is limited only in terms of the appended claims.

What is claimed is:

1. An integrated circuit for sourcing or sinking a predefined amount of current, the integrated circuit constructed in accordance with a technology characterized by process parametric tolerance variations, the circuit comprising:

a precision reference current generating circuit, defining a precision reference current;

a first transistor pair current mirror, the transistor pair mirroring the precision reference current to a first drain current;

a bias transistor configured to conduct the first drain current, the bias transistor developing a bias voltage in response to the first drain current, the bias transistor constructed in such a manner that the bias voltage developed by the bias transistor varies in an inversely proportional fashion to the bias transistor's current drive strength; and an inverse mirror transistor configured to conduct a second drain current in operative response to the bias voltage, the inverse mirror transistor constructed such that the second drain current varies in a directly proportional manner with the bias voltage.

2. The circuit according to claim 1, wherein the circuit is constructed in accordance with complimentary MOS technology.

3. The circuit according to claim 2, wherein the first drain current conducted by the bias transistor is related to its gate-to-source voltage through a proportionality constant, the proportionality constant defining the bias transistor's drive strength.

4. The circuit according to claim 3, wherein the proportionality constant comprises a process parameter k' and a geometrical aspect ratio parameter width dimension/length dimension (W/L).

5. The circuit according to claim 4, wherein the bias voltage developed by the bias transistor is equal to its gate-to-source voltage.

6. The circuit according to claim 5, wherein the inverse mirror transistor is configured to have a gate-to-source voltage equal to the bias voltage, the inverse mirror transistor conducting a drain current related to its gate-to-source voltage through a proportionality constant comprising a process parameter k' and a geometrical aspect ratio parameter width dimension/length dimension (W/L).

7. The circuit according to claim 6, wherein the geometrical aspect ratio parameter of the bias transistor is in the range of from about 10 to about 30.

8. The integrated circuit according to claim 7, wherein the geometrical aspect ratio parameter of the inverse mirror transistor varies in a range of from about 4 to about 8.

9. The integrated circuit according to claim 7, wherein the geometrical aspect ratio parameter comprises a width dimension W and a length dimension L, the width dimension of the bias transistor varying in a range of from about 6 to about 10 microns, the length dimension of the bias transistor varying in the range of from about 0.325 to about 0.425 microns.

10. The integrated circuit according to claim 8, the width dimension of the inverse mirror transistor being about 20 microns, the length dimension of the inverse mirror transistor being about 3 microns.

11. A complimentary MOS integrated circuit for sourcing or sinking a predefined amount of current, the circuit comprising:

a reference current generating circuit defining a precision reference current;

a first p-channel transistor pair configured as a first current mirror, the first current mirror defining a first drain current substantially equal to the precision reference current;

a process inverse current mirror further comprising an n-channel bias transistor and an n-channel inverse mirror transistor configured as an n-channel current mirror pair, the bias transistor connected to the p-channel current mirror at a common drain node so as to conduct the first drain current therethrough, the bias transistor defining a first bias voltage, equal to its drain-to-source voltage, at the common drain node, the first bias voltage further coupled to a common gate terminal of both the bias and inverse mirror transistors, the inverse mirror transistor conducting a second drain current in operative response to the bias voltage;

a second p-channel transistor pair configured as a second current mirror, the second current mirror defining a source current at its output drain node, the source current being dependent on the second drain current conducted by the inverse mirror transistor; and wherein the bias transistor is constructed as a short channel device such that the bias voltage defined at its drain node varies in an inversely proportional manner to its drive strength and wherein the inverse mirror transistor is constructed as a long channel device such that the second drain current conducted thereby varys in a directly proportional manner to the bias voltage without regard to the inverse mirror transistor's drive strength, the second drain current related to the first drain current through the bias voltage such that the second drain current varies in an inversely proportional manner to the bias transistor's drive strength.

12. The circuit according to claim 11, a second n-channel transistor pair configured as a current mirror, the current mirror defining a sink current at its output drain node, the n-channel current mirror mirroring the source current provided by the second p-channel current mirror to thereby define the sink current.

13. The circuit according to claim 12, wherein the second n-channel current mirror defining the sink current comprises a bias transistor configured to develop a bias voltage in operative response to the bias transistor conducting the source current and a parallel array of n-channel mirror transistors, each respective mirror transistor of the array conducting a corresponding sink current.

14. The circuit according to claim 13, wherein each respective n-channel transistor of the parallel array is constructed with a particular width dimension/length dimension (W/L) geometric aspect ratio such that each n-channel transistor of the parallel array exhibits a different proportionality between the bias voltage and its corresponding sink current.

15. The circuit according to claim 14, wherein each n-channel transistor of the parallel array is selectively enabled to conduct a corresponding sink current, such that the proportionality between bias voltage and sink current's chosen by selectively enabling particular ones of the n-channel parallel array.

16. The circuit according to claim 12, wherein the first drain current conducted by the bias transistor is related to its gate-to-source voltage through a proportionality constant, the proportionality constant defining the bias transistor's drive strength, the bias transistor's gate-to-source voltage being equal to its drain-to-source voltage and the bias voltage.

17. The circuit according to claim 16, wherein the proportionality constant comprises a process parameter k' and a geometrical aspect ratio parameter width dimension/length dimension (W/L).

18. The circuit according to claim 17, wherein the inverse mirror transistor is configured to have a gate-to-source voltage equal to the bias voltage, the inverse mirror transistor conducting a drain current related to its gate-to-source voltage through a proportionality constant comprising a process parameter k' and a geometrical aspect ratio parameter width dimension/length dimension.

19. The circuit according to claim 18, wherein the geometrical aspect ratio parameter comprises a width dimension W and a length dimension L, the width dimension of the bias transistor varying in a range of from about 6 to about 10 microns, the length dimension of the bias transistor varying in the range of from about 0.325 to about 0.425 microns.

20. The circuit according to claim 19, wherein the width dimension of the inverse mirror transistor varies in a range of from about 15 to about 25 microns, the length dimension of the inverse mirror transistor varying the range of from about 2.5 to about 3.5 microns.

* * * * *